United States Patent [19]

Fiarman et al.

[11] Patent Number: 5,451,644

[45] Date of Patent: Sep. 19, 1995

[54] AQUEOUS PROCESS FOR PREPARING WATER SOLUBLE POLYMERS OF MONOETHYLENICALLY UNSATURATED DICARBOXYLIC ACIDS

[75] Inventors: Irwin S. Fiarman, Willingboro, N.J.; Thomas F. McCallum, III, Philadelphia; Barry Weinstein, Dresher, both of Pa.

[73] Assignee: Rohm and Haas Company, Philadelphia, Pa.

[21] Appl. No.: 369,551

[22] Filed: Jan. 6, 1995

Related U.S. Application Data

[63] Continuation of Ser. No. 182,245, Jan. 14, 1994, abandoned.

[51] Int. Cl.[6] .................................. C08F 4/06
[52] U.S. Cl. ........................................ 526/93
[58] Field of Search ............................ 526/93

[56] References Cited

U.S. PATENT DOCUMENTS

| | | |
|---|---|---|
| 3,375 | 1/1943 | Creamer et al. . |
| 2,934,524 | 4/1960 | Phelps et al. ............ 526/93 |
| 4,314,044 | 2/1982 | Hughes et al. . |
| 4,519,920 | 5/1985 | Fukumoto et al. . |
| 4,555,557 | 11/1985 | Fukumoto et al. . |
| 4,659,793 | 4/1987 | Yang ......................... 526/93 |
| 4,668,735 | 5/1987 | Fukumoto et al. . |
| 4,709,091 | 11/1987 | Fukumoto et al. . |
| 4,725,655 | 2/1988 | Denzinger et al. . |
| 5,064,563 | 11/1991 | Yamaguchi et al. . |
| 5,086,133 | 2/1992 | Itoh et al. .................. 526/93 |
| 5,100,980 | 3/1992 | Hughes et al. . |
| 5,135,677 | 8/1992 | Yamaguchi et al. . |
| 5,244,988 | 9/1993 | Hughes et al. ............ 526/93 |

FOREIGN PATENT DOCUMENTS

| | | |
|---|---|---|
| 1243446 | 10/1988 | Canada . |
| 4008696 | 9/1991 | Germany . |
| 5064118 | 5/1975 | Japan . |
| 5968563 | 10/1985 | Japan . |
| 5968565 | 10/1985 | Japan . |
| 1262871 | 10/1989 | Japan . |
| 6330845 | 6/1990 | Japan . |
| 39905 | 1/1991 | Japan ....................... 526/93 |
| 1145851 | 1/1991 | Japan . |

OTHER PUBLICATIONS

1046 TMOG 2 Official Gazette Sep. 4, 1984.

*Primary Examiner*—Joseph L. Schofer
*Assistant Examiner*—N. Sarofin
*Attorney, Agent, or Firm*—Kimberly R. Hild

[57] ABSTRACT

The present invention provides an efficient aqueous polymerization process of 6 hours or less for preparing water soluble polymer products formed from 50 to 100 weight percent of one or more monoethylenically unsaturated dicarboxylic acid monomers and 0 to 50 weight percent of one or more optional other water soluble monoethylenically unsaturated monomers. In this process, 1) an aqueous reaction mixture of dicarboxylic acid monomer is formed, 2) from about 0.9 to about 2.1 equivalent moles of base are added to the reaction mixture per mole dicarboxylic acid monomer, 3) at least one metal promoter is added to the reaction mixture, 4) one or more initiators and optional other water soluble monoethylenically unsaturated monomer are fed to the reaction mixture, 5) the weight percent reaction solids during the polymerization is between about 40 and about 65 weight percent, and 6) the reaction temperature is maintained at about 80° C. to about 140° C. The polymer product produced by the process of the present invention is useful as an additive in detergents, cleaning formulations, and water circulating systems.

18 Claims, No Drawings

AQUEOUS PROCESS FOR PREPARING WATER SOLUBLE POLYMERS OF MONOETHYLENICALLY UNSATURATED DICARBOXYLIC ACIDS

This application is a continuation of application Ser. No. 08/182,245, filed Jan. 14, 1994 now abandoned.

FIELD OF INVENTION

This invention relates to an improved aqueous free radical addition polymerization process for preparing water soluble polymers formed from about 50 to 100 weight percent of one or more monoethylenically unsaturated dicarboxylic acid monomers and 0 to about 50 weight percent of one or more optional other water soluble monoethylenically unsaturated monomers. In particular, this invention relates to an efficient process which produces a polymer product containing less than about 1.5 weight percent unreacted dicarboxylic acid monomer based on the total weight of polymer product and allows for a polymerization reaction time of less than about 6 hours.

BACKGROUND OF THE INVENTION

Water soluble polymers formed from monoethylenically unsaturated dicarboxylic acid monomers, herein called "dicarboxylic acid monomers" and optionally other water soluble monoethylenically unsaturated monomers, herein called "optional other water soluble monomers" are useful as scale inhibitors, deflocculants, dispersants, in water circulating systems and as incrustation inhibitors, builders, anti-filming agents, sequestering agents, and dispersants in detergents and cleaning formulations.

Several techniques for preparing these water soluble polymers by free radical addition polymerization in aqueous systems are known. However, a common problem in forming these polymers is that the dicarboxylic acid monomer, such as maleic acid, is slow to react in comparison to the other monomers, such as acrylic acid, in free radical addition polymerizations. To compensate for this slow reactivity of the dicarboxylic acid monomer, one process which has been developed for producing these polymers is described in U.S. Pat. No. 4,659,793 to Yang, herein called "Yang". Yang discloses a process where a "heel" or solution of partially neutralized dicarboxylic acid monomer and water is first formed. The polymerization is then conducted by slowly feeding the non-dicarboxylic acid monomer and initiator into the heel, and is carried out in the presence of at least one metal ion. However, in Yang, the preferred feed time of the non-dicarboxylic acid monomer and initiator is 5 to 7 hours, and the process is limited to producing polymers containing less than 55 weight percent dicarboxylic acid monomers.

German Patent Application Number DE 40 08 696 A1 to Denzinger et al., herein called "Denzinger" discloses another "heel" process for making polymers that contain greater than 65 weight percent dicarboxylic acid monomers. In Denzinger, water soluble ethylenically unsaturated monomer and initiator are added to a heel of partially neutralized dicarboxylic acid monomer. Denzinger requires the final overall degree of neutralization of acid groups on all monomers be from 52 to 70 percent and preferably 55 to 65 percent to obtain less than 1.5 weight percent residual dicarboxylic acid monomer based on the total weight of polymer product. However, a major disadvantage to Denzinger is that the time for feeding the initiator and ethylenically unsaturated monomer in the examples is about six hours and the hold time after the completion of the feeds is about one to two hours for a total polymerization reaction time of 7 to 8 hours.

Consequently, it is an aim of the present invention to produce water soluble polymers containing about 50 weight percent to 100 weight percent dicarboxylic acid monomers where the amount of unreacted dicarboxylic acid monomer in the polymer product is less than about 1.5 weight percent based on the total weight of polymer product.

It is another aim of this invention to shorten the polymerization reaction time of the process to less than about 6 hours and still obtain a polymer product with less than about 1.5 weight percent unreacted dicarboxylic acid monomer.

SUMMARY OF THE INVENTION

We have discovered an aqueous free radical addition polymerization process for preparing a water soluble polymer product comprising:
a) forming a reaction mixture comprising at least one monoethylenically unsaturated dicarboxylic acid monomer containing 4 to 10 carbon atoms, where the total dicarboxylic acid monomer added to the reaction mixture is from about 50 to 100 weight percent based on total weight of monomer;
b) adding at least one base to the reaction mixture in an amount of about 0.9 to about 2.1 equivalent moles of the base per mole of the dicarboxylic acid monomer;
c) adding at least one metal promoter to the reaction mixture;
d) feeding to the reaction mixture at least one water soluble initiator;
e) feeding to the reaction mixture one or more optional other water soluble monoethylenically unsaturated monomers, where the total optional other water soluble monomer fed to the reaction mixture is from 0 to about 50 weight percent based on total weight of monomer;
f) maintaining the reaction mixture at a reaction temperature of from about 80° C. to about 140° C. during the polymerization;
g) maintaining the reaction mixture at a weight percent reaction solids of from about 40 to about 65 weight percent during the polymerization;
h) polymerizing the monomer for a polymerization reaction time of less than 6 hours; and
i) recovering the polymer product, where the polymer product contains less than 1.5 weight percent residual dicarboxylic acid monomer, based on the total weight of polymer product.

DETAILED DESCRIPTION OF THE INVENTION

We have discovered an improved and efficient aqueous polymerization process for making water soluble polymers formed from about 50 weight percent or more of at least one dicarboxylic acid monomer. This improved process can provide polymerization reaction times of about 6 hours or less while producing a water soluble polymer product containing less than about 1.5 weight percent unreacted dicarboxylic acid monomer through the combination and adjustment of several process variables. The process variables are 1) the amount of base present in the reaction mixture per mole of dicarboxylic acid during the polymerization, 2) the presence of a metal promoter in the reaction mixture during the polymerization, 3) the weight percent reaction solids during the polymerization, and 4) the reaction temperature. In addition to these process variables, the manner in which the initiator, and optional other water soluble monomer are added to the reaction mixture during the polymerization can aid in shortening polymerization reaction times and reducing the level of unreacted dicarboxylic acid monomer in the polymer product.

By "percent reaction solids" we mean the total weight of solids added to the reaction mixture divided by the total weight of reaction mixture and multiplied by 100 The total weight of solids in the reaction mixture is the dicarboxylic acid monomer and its salts thereof, the optional other water soluble monomer, solid initiator, solid metal promoter, and any other solids added to the reaction mixture. By "polymerization reaction time", we mean the time required to feed the initiator and monomer to the reaction mixture plus any reaction hold time. The reaction hold time is the amount of time after the feeds have been completed where the reaction mixture is maintained at the polymerization conditions to further polymerize the monomer.

The process of the present invention includes a) forming an aqueous reaction mixture of dicarboxylic acid monomer, b) adding at least one base to the reaction mixture, c) adding at least one metal promoter to the reaction mixture, d) feeding to the reaction mixture one or more water soluble initiators and one or more optional other water soluble monomers to polymerize the reaction mixture, and d) maintaining the reaction mixture temperature at a temperature of from about 80° C. to about 140° C.

In the process of the present invention, first an aqueous reaction mixture of dicarboxylic acid monomer is formed. Preferably, all the dicarboxylic acid monomer is added to the reaction mixture before feeding the one or more initiators and one or more optional water soluble monomers. However, if desired, from about 20 to about 50 weight percent of the total amount of dicarboxylic acid monomer added to the reaction mixture may be fed to the reaction mixture concurrently with the initiator and optional other water soluble monomer.

Dicarboxylic acid monomers which can be used in the process of the present invention include monoethylenically unsaturated dicarboxylic acids containing from 4 to about 10, preferably from about 4 to about 6, carbon atoms per molecule and the anhydrides of the cis dicarboxylic acids. Examples of suitable dicarboxylic acid monomers include maleic acid, itaconic acid, mesaconic acid, fumaric acid, citraconic acid, alpha-methylene glutaric acid, and the anhydrides of cis dicarboxylic acids, such as maleic anhydride, cis-3,4,5,6-tetrahydrophthalic anhydride, and combinations thereof. Maleic anhydride and maleic acid are the most preferable of these monomers. The weight percent dicarboxylic acid monomer based on the total weight of monomers may be from about 50 to 100 weight percent, preferably from about 60 to 100, more preferably from about 70 to about 100, and most preferably from about 85 to 100 weight percent.

To the reaction mixture is also added one or more bases. Generally, for the process of the present invention, from about 0.90 to about 2.10 equivalent moles of base should be added per mole of dicarboxylic acid monomer. By "equivalent" we mean moles of active base that will react with one mole of acid. Overall, the preferable equivalent moles of base added per mole dicarboxylic acid monomer is about 0.90 to about 1.80; more preferably is about 0.95 to about 1.65, and most preferably is about 1.00 to about 1.60.

However, the amount of base added to the reaction mixture within the ranges indicated herein depends on the weight percent of dicarboxylic acid monomer desired in the polymer product. Generally, as the desired weight percent of dicarboxylic acid monomer in the polymer product increases, the amount of base added per mole dicarboxylic acid monomer should decrease within the ranges indicated. For example, when making a polymer product formed from 100 to about 70 weight percent dicarboxylic acid monomer, based on total monomer, about 0.90 to about 1.70 equivalent moles of base per mole dicarboxylic acid monomer should be added. When making a polymer formed from about 50 to about 70 weight percent dicarboxylic acid monomer, about 1.20 to about 2.10 equivalent moles of base per mole dicarboxylic acid monomer should be added.

The one or more bases added to the reaction mixture may be for example ammonium hydroxide, or an alkali metal base such as sodium hydroxide, potassium hydroxide, or lithium hydroxide. Preferably the base is sodium hydroxide. The base may be added as a solid or liquid to the reaction mixture.

In a preferred embodiment of the process of the present invention, all the base is added to the reaction mixture before the feeds of initiator and monomer are begun. By "monomer" herein we mean to include both the dicarboxylic acid monomer and optional other water soluble monomer. In this preferred embodiment, the base may be added to the reaction mixture immediately after forming the reaction mixture of dicarboxylic acid monomer. Alternatively, the base may be added to dicarboxylic acid monomer before forming the reaction mixture. For example, disodium maleate which was formed by neutralizing maleic acid with sodium hydroxide, could be combined with a reaction mixture of maleic acid and water.

In another embodiment of the process of the present invention, up to about 50 percent of the total moles of base added to the reaction mixture may be added concurrently with the feeds of initiator and monomer. In this other embodiment, the base may be fed separately to the reaction mixture or may be added to one or more monomer feeds.

To the reaction mixture is also added at least one metal promoter. The metal promoter enhances the conversion of the dicarboxylic acid monomer to polymer product. Metal promoters useful in the present invention are water soluble transition metal salts such as the salts of cobalt, iron, copper, cerium, nickel, manganese, molybdenum, zirconium, vanadium, zinc, and combinations thereof. Useful water soluble metal salts must be capable of generating the metal ion in an aqueous solution and include the salts of sulfates, nitrates, chlorides, bromides, acetates, phosphates and gluconates; such as for example ferrous sulfate heptahydrate, cuprous acetate, ferrous acetate, manganese acetate, cupric acetate, ferrous and ferric chloride, ferrous and ferric phosphate, cuprous and cupric chloride, cuprous and cupric bromide, cupric nitrate, ferric sulfate, manganese bromide, manganese chloride, and combinations thereof. Preferred metal promoters are the water soluble metal salts of iron and copper and combinations thereof.

The metal promoter may be added to the reaction mixture at different stages in the polymerization. For example, the metal promoter may be added to the reaction mixture before beginning the feeds of initiator and monomer, or may be gradually fed into the reaction mixture during the polymerization. If the metal promoter is fed into the reaction mixture, it may be fed to the reaction mixture in a separate stream or added to another feed and fed into the reaction mixture. If the metal promoter is fed separately, it may be fed simultaneously with the other feeds or staggered such that it begins or ends at different times from the other feeds. The concentration in the reaction mixture of the metal promoter should be from about 0.25 to about 250 parts per million (ppm) of the metal ion based on the total weight of the monomers. Preferably the concentration of metal ion is from about 1 to about 25 ppm, and most preferably from about 3 to about 20 ppm.

To polymerize the reaction mixture, one or more water soluble initiators and if desired in the polymer product, one or more optional other water soluble monomers, are fed to the reaction mixture in separate feeds. As stated previously, other optional feeds include from about 20 to about 50 percent of the total weight of dicarboxylic acid monomer, and up to 50 percent of the total moles of base. These other optional feeds may be fed to the reaction mixture concurrently with the feeds of initiator and optional other water soluble monomer.

The time necessary for feeding the initiator and optional other water soluble monomer depends on such process variables as the amount of base added to the reaction mixture, the amount of metal promoter added to the reaction mixture, the weight percent reaction solids during the polymerization, and the reaction temperature. Also, the manner in which the initiator and optional other water soluble monomer are added to the reaction mixture during the polymerization can aid in shortening polymerization reaction times.

For the process of this invention, generally, the time necessary for feeding the initiator and the optional other water soluble monomer is from about 2 to about 5 hours. Preferably the feed time is less than 4 hours and most preferably less than 3 hours. The other optional feeds may be fed to the reaction mixture for the same or less feed time as the initiator and the optional water soluble monomer. By increasing the feed time of initiator and monomer, the amount of unreacted dicarboxylic acid monomer will decrease, but the processing costs will increase due to increased polymerization reaction times.

The initiator and optional other water soluble monomer are typically added to the reaction mixture in separate feeds concurrently for the same amount of time. For example, the initiator and optional other water soluble monomer may be fed separately and linearly (at a constant rate) into the reaction mixture over a three hour feed period. However, for improved conversion of dicarboxylic acid monomer it may be desirable to extend the feed of the initiator such that less than 10 weight percent of the total initiator feed is fed alone after all the other feeds have been completed.

In a preferred embodiment of the process of the present invention, it is desirable to add a portion of the initiator and optional other water soluble monomer, if desired in the polymer product, to the reaction mixture before beginning any of the feeds. This addition begins the polymerization reaction and is believed to aid in reacting the dicarboxylic acid monomer. Typically the addition consists of 1) from about 5 to about 20, preferably from about 10 to about 15, weight percent of the total initiator, and 2) from about 10 to about 20, preferably from about 10 to about 15, weight percent of the total optional other water soluble monomer. Immediately after this addition, the temperature of the reaction mixture rises rapidly. Preferably, the feeds are started after the exotherm from this addition subsides.

The weight percent optional other water soluble monomer based on the total weight of monomers added to the reaction mixture may be from 0 to about 50, preferably from 0 to about 40, more preferably about 5 to about 30, and most preferably about 5 to about 15 weight percent. The optional water soluble monomers useful in the process of the present invention include water soluble monoethylenically unsaturated monocarboxylic acids and salts thereof, monoethylenically unsaturated carboxyl-free monomers, and combinations thereof.

The monoethylenically unsaturated monocarboxylic acids contain from 3 to 6 carbon atoms per molecule and include acrylic acid, methacrylic acid, vinylacetic acid, crotonic acid, and their salts, and combinations thereof. The most preferred monoethylenically unsaturated monocarboxylic acids are acrylic acid, methacrylic acid, and combinations thereof.

The monoethylenically unsaturated carboxyl free monomers include alkyl esters of acrylic or methacrylic acids such as methyl acrylate, ethyl acrylate, butyl acrylate, methyl methacrylate, ethyl methacrylate, butyl methacrylate and isobutyl methacrylate; hydroxyalkyl esters of acrylic or methacrylic acids such as hydroxyethyl acrylate, hydroxypropyl acrylate, hydroxyethyl methacrylate, and hydroxypropyl methacrylate; acrylamide, methacrylamide, N-tertiary-butylacrylamide, N-methylacrylamide, N,N-dimethylacrylamide; acrylonitrile, methacrylonitrile, allyl alcohol, allylsulfonic acid, allyl phosphonic acid, vinylphosphonic acid, dimethylaminoethyl acrylate, dimethylaminoethyl methacrylate, phosphoethyl methacrylate, N-vinylpyrollidone, N-vinylformamide, N-vinylimidazole, vinyl acetate, styrene, vinylsulfonic acid and its salts, and 2-acrylamido-2-methylpropanesulfonic acid and its salts, and combinations thereof.

Suitable water-soluble initiators for the process of the present invention are any conventional free radical water-soluble initiator, water-soluble redox initiator, and combinations thereof. The total initiator added to the reaction mixture should be from about 0.5 to about 25 weight percent based on the total amount of monomer added. Generally, as the weight percent of dicarboxylic acid monomer increases, the amount of initiator used should increase within the range of from about 0.5 to about 25 weight percent. For example, when making a polymer product formed from 100 to about 70 weight percent dicarboxylic acid monomer, preferably about 2 to about 25 weight percent initiator should be added, based on the total weight of monomer added. When making a polymer formed from about 50 to about 70 weight percent dicarboxylic acid monomer, preferably about 1 to about 10 weight percent initiator should be added, based on the total weight of monomer added.

Suitable free-radical initiators include hydrogen peroxide, certain alkyl hydroperoxides, dialkyl peroxides, persulfates, peresters, percarbonates, perphosphates, ketone peroxides, and azo initiators and combinations thereof. Specific examples of free-radical initiators include for example hydrogen peroxide, t-butyl hydroperoxide, di-tertiary butyl peroxide, ammonium persulfate, potassium persulfate, sodium persulfate, sodium perphosphate, ammonium perphosphate, tertiary-amyl hydroperoxide, methylethyl ketone peroxide, 2,2-azobis(cyanovaleric acid), and combinations thereof. The free-radical initiators are preferably used in amounts of from about 5 to about 20 weight percent initiator based on the total monomer weight.

Suitable water-soluble redox initiators include, but are not limited to, sodium bisulfite, sodium sulfite, persulfates, hypophosphites, isoascorbic acid, sodium formaldehydesulfoxylate and combinations thereof. The redox initiators are preferably used in amounts of from about 0.5 to about 20 weight percent and more preferably used in amounts of from about 1.0 to about 15.0 percent, based on the weight of total monomer.

A preferred method for making the polymer product of the present invention uses a combination of both the free-radical initiator and the redox initiator. A preferable combination of initiators is persulfate and peroxide such as hydrogen peroxide and sodium persulfate.

The percent reaction solids throughout the polymerization should be from about 40 to about 65 weight percent and preferably from about 50 to about 60 weight percent, based on the total weight of the reaction mixture, to achieve less than 1.5 weight percent dicarboxylic acid monomer in the polymer product in less than 6 hours. When the weight percent of dicarboxylic acid monomer is increased within the range of 50 to 100 weight percent, the percent reaction solids should increase within the range of 40 to about 65 weight percent. For example, when making a polymer product formed from 100 to about 70 weight percent dicarboxylic acid monomer, preferably the percent reaction solids should be from about 50 to about 65 weight percent. When making a polymer product formed from about 50 to about 70 weight percent dicarboxylic acid monomer, preferably the percent reaction solids should be from about 40 to about 55 weight percent.

The temperature of the reaction mixture during the polymerization should be maintained slightly below the boiling point of the reaction mixture. The reaction mixture temperature should be maintained at a temperature of from about 80° to about 140° C., preferably from about 80° to about 110° C., and more preferably from about 92° to about 110° C. during the polymerization. The reaction mixture pressure should be maintained at a pressure of from about atmospheric to about 40 pounds per square inch gauge (psig). Preferably, the reaction mixture pressure is maintained at atmospheric pressure. The polymerization may be conducted in air or any inert atmosphere such as nitrogen or argon.

After the feeds are complete, the reaction mixture may optionally be maintained at the reaction temperature of about 80° to about 140° C. for a reaction hold time of 0 to 90 minutes to allow for further conversion of dicarboxylic acid monomer. Preferably the reaction hold time is less than 60 minutes and most preferably less than 30 minutes.

The process of the present invention allows for a polymerization reaction time of less than 6 hours, preferably less than 5 hours, and most preferably less than 3.5 hours. Of course as the polymerization reaction time is increased, the conversion of dicarboxylic acid monomer to polymer product will increase.

At the completion of the polymerization, the residual level of dicarboxylic acid monomer in the polymer product should be less than 1.5 weight percent, preferably less than 1.1 weight percent and most preferably less than 0.9 weight percent, based on the total weight of polymer product.

After the polymerization, the level of residual monomer may be reduced by adding one or more initiators or reducing agents which can assist scavenging of unreacted monomer. Preferably, any post-polymerization additions of initiators or reducing agents are conducted at or below the polymerization temperature. Generally, any of the initiators suitable for the polymerization are also suitable for reducing the residual monomer content of the polymer mixture.

Typically, the level of initiator or reducing agent added to reduce the residual monomer content of the polymer product is in the range of from about 0.5 to about 5.0, and preferably from about 1.0 to about 4.0 weight percent based on the total amount of monomer.

After the polymerization, the polymer product may be recovered and used as is, separated by conventional techniques to isolate the polymer solids, or diluted with water to adjust the percent reaction solids to less than 40 weight percent. If desired, excess initiator in the polymer product may be reduced with one or more common reducing agents such as sodium metabisulfite or isoascorbic acid. Additionally, the pH of the polymer product may be adjusted such as for example by adding a common base such as sodium hydroxide.

The molecular weight of the polymer product produced by the process of the present invention is from about 500 to about 40,000 molecular weight, preferably from about 1000 to about 30,000, more preferably from about 1000 to about 20,000, and most preferably from about 1,000 to about 10,000 as measured by gel permeation chromatography (GPC) based on a relative standard of 4500 molecular weight poly(acrylic acid).

The water soluble polymer product produced by the process of the present invention is useful as additives in cleaning compositions such as cleaning or detergent formulations used for hard surfaces; household, industrial and institutional laundry; and hand and automatic dishwashing. For example, the polymer product may be used as a builder, incrustation inhibitor, antiredeposition agent, anti-filming agent, sequestering agent, soil removal agent, and dispersant in cleaning and detergent formulations.

The polymer product is also useful for scale inhibition and corrosion control in any water circulating system such as those systems used in cooling water towers, boilers, water desalination plants, sugar recovery plants, oil drilling wells, reverse osmosis equipment, steam power plants, and heat exchange equipment.

The polymer product of the present invention may also be used as a dispersant for inorganic particulates such as pigments, kaolin clay, ceramics, calcium carbonate, zeolites, titanium dioxide; for aqueous emulsions such as latex paints and glazes; and for drilling muds. The polymer product is also useful as a dispersing agent in paper making.

The polymer product is particularly useful as an additive in cleaning compositions such as in cleaning and detergent formulations. Cleaning and detergent formulations containing the polymer product may be in any of the usual physical forms, such as powders, beads, flakes, bars, tablets, noodles, liquids, pastes, slurries and the like. The cleaning and detergent formulations are prepared and utilized in the conventional manner and are usually based on surfactants, and optionally, on either precipitant or sequestrant builders.

Suitable surfactants are, for example, anionic surfactants, such as from $C_8$ to $C_{12}$ alkylbenzenesulfonates, from $C_{12}$ to $C_{16}$ alkanesulfonates, from $C_{12}$ to $C_{16}$ alkylsulfates, from $C_{12}$ to $C_{16}$ alkylsulfosuccinates and from $C_{12}$ to $C_{16}$ sulfated ethoxylated alkanols and nonionic surfactants such as from $C_6$ to $C_{12}$ alkylphenol ethoxylates, from $C_{12}$ to $C_{20}$ alkanol alkoxylates, and block copolymers of ethylene oxide and propylene oxide. Optionally, the end groups of polyalkylene oxides can be blocked, whereby the free OH groups of the polyalkylene oxides can be etherified, esterified, acetalized and/or aminated. Another modification consists of reacting the free OH groups of the polyalkylene oxides with isocyanates. The nonionic surfactants also include $C_4$ to $C_{18}$ alkyl glucosides as well as the alkoxylated products obtainable therefrom by alkoxylation, particularly those obtainable by reaction of alkyl glucosides with ethylene oxide. The surfactants usable in detergents can also have an amphoteric character and they can be soaps.

In general, the surfactants constitute from 2 to 50, preferably 5 to 45 percent by weight of the cleaning or detergent formulation. Liquid detergent or cleaning formulations usually contain as components liquid or even solid surfactants which are soluble or at least dispersible in the formulation. Surfactants suitable for this purpose are liquid polyalkylene oxides or polyalkoxylated compounds, products that can also be used in powdered detergents.

Examples of sequestrant builders contained in the cleaning and detergent formulations can include phosphates, specifically, pyrophosphates, polyphosphates, and especially sodium tripolyphosphate. Further examples are the zeolites, sodium carbonate, poly(carboxylic acids), nitrilotriacetic acid, citric acid, tartaric acid, the salts of the aforesaid acids and the monomeric, oligomeric or polymeric phosphonates.

The amounts of the individual substances used in the preparation of cleaning and detergent formulations by weight based on the total weight of the formulation are, for example, up to 85 weight percent sodium carbonate, up to 45 weight percent phosphates, up to 40 weight percent zeolites, up to 30 weight percent nitrilotriacetic acid and phosphonates and up to 30 weight percent polycarboxylic acids. In certain liquid detergent markets the use of builders is usually limited to citric acid and its salts or a combination of citrate and fatty acid soap, while in other markets liquid detergent compositions incorporate an intermediate level of soap, about 15 weight percent, or tripolyphosphate, about 20 weight percent, to assist overall cleaning efficacy.

Other common additives to cleaning compositions and especially detergent formulations are bleaching agents, used in an amount of up to 30 weight percent; corrosion inhibitors, such as silicates, used in an amount of up to 25 weight percent; dye transfer inhibiting agents, used in an amount up to 20 weight percent; and graying inhibitors used in an amount of up to 5 weight percent. Suitable bleaching agents are, for example, perborates, percarbonates or chlorine-generating substances, such as chloroisocyanurates. Suitable silicates used as corrosion inhibitors are, for example, sodium silicate, sodium disilicate and sodium metasilicate. Suitable dye transfer inhibiting agents are for example poly(vinyl pyrrolidone). Examples of graying inhibitors are carboxymethylcellulose, methylcellulose, hydroxypropylmethylcellulose and graft copolymers of vinyl acetate and polyalkylene oxides having a molecular weight of 1,000 to 15,000. Other common optional additives used in cleaning compositions and especially detergent formulations are optical brighteners, enzymes and perfumes.

Powdered detergent formulations can also contain up to 50 weight percent of an inert diluent, such as sodium sulfate, sodium chloride, or sodium borate. The detergent formulations can be anhydrous or they can contain small amounts, for example up to 10 weight percent, of water. Liquid detergents can contain up to 80 weight percent water as an inert diluent.

One or more of the polymer products produced from the process of the present invention can be added to cleaning compositions including cleaning and detergent formulations at levels where they provide the intended benefit. Generally, this level will be from about 0.5 to about 50 weight percent, preferably from about 1 to about 40 weight percent of polymer product, based on the total weight of the formulation. For example, if the polymer product is used as a builder in a detergent or cleaning formulation, the level in the formulation will be from about 5 to about 40 weight percent, based on the total weight of the formulation. In some cases, particularly when used as a soil removal agent and soil redeposition inhibitor, the amount of polymer product actually used is preferably between about 2 and 10 weight percent, based on the cleaning and detergent formulation. Of particular importance is the use of the additives according to the invention in low-phosphate detergents and cleaning agents, particularly those containing a precipitant builder such as sodium carbonate. The low-phosphate formulations contain up to a maximum of 25 weight percent of sodium tripolyphosphate or pyrophosphate. If desired, the polymer product prepared according to the process of the present invention can be used in detergent formulations together with other acrylic acid homopolymers. The acrylic acid homopolymers are currently being used as soil redeposition inhibitors in detergent formulations. The polymer product can be added to detergent and cleaning formulations in partially neutralized or completely neutralized form.

Other preferred applications for the polymer product produced by the process of this invention include its use in water circulating systems. In water circulating systems, the polymer product may act as a dispersant, and may also act as an anti-nucleating agent where minor amounts of the polymer product can serve as a threshold inhibitor for crystal formation or scaling. Water circulating systems in which the polymer product is useful include those systems used for cooling water towers, boilers, water desalination plants, sugar recovery plants, oil drilling wells, reverse osmosis equipment, steam power plants, and heat exchange equipment. When used to inhibit crystal formation or scaling, the polymers are often combined with corrosion inhibitors such as inorganic or organic phosphates or phosphonates or metallic salts such as zinc compounds and the like.

The polymer product can be added directly to the aqueous system in an amount of 0.1 to 500 ppm by weight. The polymer product may also be added to the system as a concentrated aqueous composition containing one or more inert diluents wherein the polymer product is present in the composition at a level of from 20 percent to 60 percent by weight.

EXAMPLES

The following examples are presented to illustrate the preparation of polymer product prepared according to the process of the present invention and are presented by way of illustration and are not to be construed as limiting the scope of this invention as defined in the claims.

The weight average molecular weights (Mw) and the number average molecular weights (Mn) in Examples 1–9 were measured by aqueous gel permeation chromatography (GPC) relative to a 4,500 Mw poly(acrylic acid) standard.

Preparation of 50 Maleic Acid/50 Acrylic Acid Copolymer

EXAMPLE 1

To a three liter four neck round bottom flask equipped with a mechanical stirrer, reflux condenser, thermometer, feeding system, nitrogen inlet, heating mantle and temperature control devise were added 200.40 grams of deionized water, 262.50 grams of maleic acid, and 361.90 grams of a 50 weight percent aqueous solution of sodium hydroxide, and 21.00 grams of a 0.15 weight percent solution of iron sulfate heptahydrate ($FeSO_4.7H_2O$) dissolved in deionized water to form a reaction mixture. This reaction mixture was heated to 98° C. Next, 87.50 grams of acrylic acid and 10.00 grams of an initiator solution consisting of 35.30 grams of deionized water, 4.40 grams of sodium persulfate and 58.50 grams of 30 weight percent aqueous solution of hydrogen peroxide were added to the reaction mixture. After this addition, 3 separate feeds were started of 1) the remaining initiator solution 2) 350.10 grams of acrylic acid and 3) sodium maleate solution consisting of 175.00 grams of maleic acid, 241.80 grams of 50 weight percent aqueous solution of sodium hydroxide, and 280.23 grams of deionized water. All three feeds were fed linearly over the times shown below:

acrylic acid—180 minutes
initiator solution—180 minutes
sodium maleate solution—110 minutes The reaction temperature during the feeds was maintained at 98° C. When the addition of the three feeds was complete, a solution of 3.53 grams of sodium persulfate in 10.00 grams of deionized water was added to the reaction mixture and then held at 98° C. for 30 minutes. The reaction mixture was cooled to 80° C. and a solution of 10.50 grams of sodium metabisulfite in 30.00 grams of deionized water was added. The pH of the reaction mixture was adjusted to a pH of 7.2 with the addition of 311.90 grams of a 50 weight percent aqueous solution of sodium hydroxide. The molecular weight of the polymer product is reported in Table 1. The weight percent residual maleic acid is also reported in Table 1 as measured before the 30 minute hold.

Example 1 illustrates a method for preparing a polymer product formed from 50 weight percent maleic acid and 50 weight percent acrylic acid using the process of the present invention. As Example 1 illustrates, a portion of the maleic acid may be cofed in a separate feed while the initiator and optional water soluble monomer are fed. The post polymerization treatment with initiator and reducing agent lowers the residual maleic acid to below a nondetectable level of less than 62.5 ppm.

Preparation of 62.9 Maleic Acid/37.1 Acrylic Acid Copolymer

EXAMPLE 2

To a one liter four neck round bottom flask equipped with a stirrer, reflux condenser, thermometer, feeding system, nitrogen inlet, heating mantle and temperature control devise were added 80.00 grams of deionized water, 137.30 grams of maleic anhydride, 112.00 grams of a 50 weight percent aqueous solution of sodium hydroxide, and 5.00 grams of a 0.15 weight percent solution of iron sulfate heptahydrate ($FeSO_4.7H_2O$) dissolved in deionized water to form a reaction mixture. This reaction mixture was heated to 100° C. Next, 27.50 grams of an acrylic acid solution consisting of 31.25 weight percent acrylic acid, 31.25 weight percent of a 50 weight percent aqueous solution of sodium hydroxide, and 37.50 weight percent of deionized water; and an initiator solution consisting of 0.70 grams of sodium persulfate and 3.40 grams of 30 weight percent aqueous solution of hydrogen peroxide were added to the reaction mixture. Then, a second acrylic acid solution consisting of 87.50 grams of acrylic acid, 100.00 grams of deionized water and 87.50 grams of a 50 weight percent aqueous solution of sodium hydroxide, and a second initiator solution consisting of 6.82 grams sodium persulfate and 34.00 grams of 30 weight percent aqueous solution of hydrogen peroxide were each fed linearly over 150 minutes. During the feeds, the reaction mixture temperature was maintained at 100° C. At the end of the feeds, the reaction mixture was maintained at 100° C. for a reaction hold time of 30 minutes. The resulting polymer product had a molecular weight and weight percent residual maleic acid content as reported in Table 1.

Example 2 illustrates a method for preparing a polymer product formed from 62.9 weight percent maleic acid and 37.1 weight percent acrylic acid using the process of the present invention. As Example 2 illustrates, a portion of the base may be added to the acrylic acid monomer feed to produce a solution of sodium acrylate.

Preparation of 70 Maleic Acid/30 Acrylic Acid Copolymer

EXAMPLE 3

To a one liter four neck round bottom flask equipped with a stirrer, reflux condenser, thermometer, feeding system, nitrogen inlet, heating mantle and temperature control devise were added 80.00 grams of deionized water, 147.90 grams of maleic anhydride, 195.80 grams of a 50 weight percent aqueous solution of sodium hydroxide, and 5.00 grams of a 0.15 weight percent solution of iron sulfate heptahydrate ($FeSO_4.7H_2O$) dissolved in deionized water to form a reaction mixture. This reaction mixture was heated to 98° C. Next, 7.50 grams of acrylic acid and 7.00 grams of an initiator solution consisting of 6.25 grams of sodium persulfate, 33.30 grams of 30% hydrogen peroxide, and 20.00 grams of deionized water were added to the reaction mixture. Then, a) 67.50 grams of acrylic acid, and b) the remaining initiator solution were each fed linearly over 150 minutes. During the feeds, the reaction mixture temperature was maintained at 98° C. At the end of the feeds, the reaction mixture was maintained at 98° C. for a reaction hold time of 30 minutes. The reaction mixture was cooled to 80° C. and a solution containing 7.50 grams sodium metabisulfite in 25.00 grams of deionized water was added followed by the addition of 90.00 grams of deionized water. The resulting polymer product had a molecular weight, and weight percent residual maleic acid content as reported in Table 1.

EXAMPLE 4

To a two liter four neck round bottom flask equipped with a stirrer, reflux condenser, thermometer, feeding system, nitrogen inlet, heating mantle and temperature control devise were added 184.00 grams of deionized water, 296.00 grams of maleic anhydride, and 386.00 grams of a 50 weight percent aqueous solution of sodium hydroxide to form a reaction mixture. This reaction mixture was heated to 98° C. Next, 20.00 grams of a 0.15 weight percent solution of iron sulfate heptahydrate ($FeSO_4.7H_2O$) dissolved in deionized water was added to the reaction mixture. Then, 22.50 grams of acrylic acid and 14.00 grams of an initiator solution consisting of 25.00 grams of sodium persulfate, 83.00 grams of 30 weight percent aqueous solution of hydrogen peroxide, and 30.00 grams of deionized water were added to the reaction mixture. Then, a) 127.50 grams of acrylic acid, and b) the remaining initiator solution were each fed linearly over 180 minutes. At the end of the feeds, the reaction mixture was maintained at 98° C. for a reaction hold time of 30 minutes. The reaction mixture was cooled to 70° C. and a solution containing 10.00 grams sodium metabisulfite in 20.00 grams of deionized water was added followed by the addition of 75.00 grams of deionized water and 2.50 grams of 30 weight percent aqueous solution of hydrogen peroxide. The resulting polymer product had a molecular weight and weight percent residual maleic acid content as reported in Table 1.

EXAMPLE 5

To a one liter four neck round bottom flask equipped with a stirrer, reflux condenser, thermometer, feeding system, nitrogen inlet, heating mantle and temperature control devise were added 88.30 grams of deionized water, 147.90 grams of maleic anhydride, 120.70 grams of a 50 weight percent aqueous solution of sodium hydroxide, and 5.00 grams of a 0.15 weight percent solution of iron sulfate heptahydrate ($FeSO_4.7H_2O$) dissolved in deionized water to form a reaction mixture. This reaction mixture was heated to 100° C. Next, 24.00 grams of an acrylic acid solution consisting of 75.00 grams of acrylic acid, 75.00 grams of a 50 weight percent aqueous solution of sodium hydroxide, and 90.00 grams of deionized water, and an initiator solution consisting of 0.57 grams of sodium persulfate and 3.33 grams of 30% hydrogen peroxide were added. Then, the remaining acrylic acid solution, and a second initiator solution consisting of 5.07 grams sodium persulfate and 30.00 grams of 30% hydrogen peroxide were each fed linearly over 150 minutes. During the feeds, the reaction mixture temperature was maintained at 100° C. At the end of the feeds, the reaction mixture was maintained at 100° g for a reaction hold time of 30 minutes. The resulting polymer product had a molecular weight and weight percent residual maleic acid content as reported in Table 1.

Examples 3, 4 and 5 illustrate methods for preparing a polymer product formed from 70 weight percent maleic acid and 30 weight percent acrylic acid using the process of the present invention. Examples 3 and 4 also demonstrate that the polymerization reaction time may be lowered from 3.5 hours to 2.5 hours while still maintaining the low residual maleic acid content in the polymer product.

Preparation of 80 Maleic Acid/20 Acrylic Acid Copolymer

COMPARATIVE EXAMPLE 6

To a two liter round bottom flask equipped with a stirrer, reflux condenser, thermometer, feeding system, nitrogen inlet, heating mantle and temperature control devise were added 86.20 grams of deionized water, 427.60 grams of a 50 weight percent aqueous solution of sodium hydroxide, and 338.00 grams of maleic anhydride to form a reaction mixture. This reaction mixture was heated to 98° C. To the reaction mixture, a) 100.00 grams of acrylic acid in 110 grams of deionized water was added linearly over 94 minutes and b) an initiator solution consisting of 20.00 grams of sodium persulfate, 66.60 grams of a 30 weight percent aqueous solution of hydrogen peroxide, and 93.40 grams deionized water was fed linearly over 112.5 minutes. During the feeds, the the reaction mixture temperature was maintained at 98° C. At the end of the feeds, the reaction mixture was maintained at 98° C. for a reaction hold time of 37.5 minutes. The resulting polymer product had a molecular weight and weight percent residual maleic acid as reported in Table 1.

EXAMPLE 7

To the reactor described in Comparative Example 6 were added 43.00 grams of deionized water, 213.80 grams of a 50 weight percent aqueous solution of sodium hydroxide, and 169.00 grams of maleic anhydride to form a reaction mixture. This reaction mixture was heated to 98° C. Next, 10 grams of a 0.15 weight percent solution of iron sulfate heptahydrate ($FeSO_4.7H_2O$) dissolved in deionized water was added to the reaction mixture. Then, 7.50 grams of acrylic acid and 5.75 grams of an initiator solution consisting of 10.00 grams of sodium persulfate, 33.30 grams of 30 weight percent aqueous solution of hydrogen peroxide, and 14.60 grams of deionized water were added. Following this addition, a) 42.50 grams of acrylic acid in 10.60 grams of deionized water, and b) the remaining initiator solution were each fed linearly over 120 minutes. During the feeds, the reaction mixture temperature was maintained at 98° C. At the end of the feeds, the reaction mixture was maintained at 98° C. for a reaction hold time of 30 minutes. The resulting polymer product had a molecular weight and weight percent residual maleic acid content as reported in Table 1.

EXAMPLE 8

To the reactor described in Comparative Example 6 were added 338.00 grams of maleic anhydride, 165.00 grams of deionized water, and 330.90 grams of a 50 weight percent aqueous solution of sodium hydroxide to form a reaction mixture. This reaction mixture was heated to 98° C. Next, 20 grams of a 0.15 weight percent solution of iron sulfate heptahydrate ($FeSO_4.7H_2O$) dissolved in deionized water was added to the reaction mixture. Then, 15.00 grams of acrylic acid and 12.00 grams of an initiator solution consisting of 20.00 grams of sodium persulfate, 66.60 grams of 30 weight percent aqueous solution of hydrogen peroxide, and 33.00 grams of deionized water were added to the reaction mixture. Following this addition, a) 85.00 grams of acrylic acid in 21.25 grams of deionized water, and b) the remaining initiator solution were each fed linearly over 120 minutes. During the feeds, the the reaction mixture temperature was maintained at 98° C. At the end of the feeds, the reaction mixture was maintained at 98° C. for a reaction hold time of 30 minutes. The resulting polymer product had a molecular weight and weight percent residual maleic acid as reported in Table 1.

EXAMPLE 9

To the reactor described in Comparative Example 6 were added 172.00 grams of deionized water, 270.40 grams of maleic anhydride, and 264.70 grams of a 50 weight percent aqueous solution of sodium hydroxide to form a reaction mixture. This reaction mixture was heated to 98° C. Next, 4.00 grams of a 0.15 weight percent solution of iron sulfate heptahydrate (FeSO$_4$.7-H$_2$O) dissolved in deionized water was added to the reaction mixture. Then, 12.00 grams of acrylic acid and 10.00 grams of an initiator solution consisting of 18.00 grams of sodium persulfate, 60.00 grams of 30 weight percent aqueous solution of hydrogen peroxide, and 25.00 grams of deionized water were added to the reaction mixture. Following this addition, a) 68.00 grams of acrylic acid in 17.00 grams of deionized water, and b) the remaining initiator solution were each fed linearly over 180 minutes. At the end of the feeds, the reaction mixture was maintained at 98° C. for a reaction hold time of 30 minutes. The reaction mixture was cooled to 70° C. and a solution of 9.30 grams of sodium metabisulfite in 20.00 grams of deionized water was added followed by the addition of 150.00 grams of deionized water. The pH of the reaction mixture was adjusted to a pH of 7.0 with the addition of 125.00 grams of a 50 weight percent aqueous solution of sodium hydroxide. The resulting polymer product had a molecular weight and weight percent residual maleic acid content as reposed in Table 1.

Examples 7, 8, and 9 illustrate methods for preparing a polymer product formed from 80 weight percent maleic acid and 20 weight percent acrylic acid using the process of the present invention. Example 7 compared with Comparative Example 6 demonstrates that a metal promoter is needed to achieve low residual maleic acid content when the polymerization reaction time is reduced to 2.5 hours. Examples 8 and 9 demonstrate that when 1.20 moles of NaOH are added per mole of maleic acid monomer, the residual maleic acid content is kept below 1 weight percent while maintaining a polymerization reaction time of less than 3 hours.

Preparation of Copolymers Greater than 90 Weight Percent Maleic Acid

EXAMPLE 10

To a one liter four neck round bottom flask equipped with a stirrer, reflux condenser, thermometer, feeding system, nitrogen inlet, heating mantle and temperature control devise, were added 50.00 grams of deionized water, 187.40 grams of a 50 weight percent aqueous solution of sodium hydroxide, and 226.50 grams of maleic acid to form a reaction mixture. This reaction mixture was heated to 98° C., at which time 6.00 grams of a 0.15 weight percent solution of iron sulfate heptahydrate dissolved in deionized water and 1.32 grams of a 0.15 weight percent solution of copper sulfate pentahydrate dissolved in deionized water was added to the reaction mixture. Next, an initiator solution was prepared by combining of 20.00 grams of sodium persulfate and 67.00 grams of 30 weight percent aqueous solution of hydrogen peroxide. Then, 2.50 grams of acrylic acid and 9.00 grams of the initiator solution were added to the reaction mixture. Following this addition, 2 separate feeds were started of 1) the remaining initiator solution, and 2) 21.00 grams of acrylic acid. The initiator solution and acrylic acid were fed linearly over 120 minutes while maintaining the reaction mixture temperature at 98° C. After the feeds were complete, the reaction mixture was held at a temperature of 98° C. for 30 minutes. The reaction mixture was cooled to 80° C and a solution of 6.00 grams of sodium metabisulfite and 25.00 grams of deionized water was added. The molecular weight of the polymer product is reported in Table 1. The weight percent residual maleic acid is also reported in Table 1 as measured before the 30 minute hold.

EXAMPLE 11

To a one liter four neck round bottom flask equipped with a mechanical stirrer, reflux condenser and addition funnels, were added 83.40 grams of deionized water, 211.40 grams of maleic anhydride, and 189.50 grams of a 50 weight percent aqueous solution of sodium hydroxide to form a reaction mixture. This reaction mixture was heated to 98° C., at which time 6.00 grams of a 0.15 weight percent solution of iron sulfate heptahydrate dissolved in deionized water and 1.30 grams of a 0.15 weight percent solution of copper sulfate pentahydrate dissolved in deionized water were added to the reaction mixture. Next, an initiator solution was prepared by combining of 20.00 grams of sodium persulfate and 125.00 grams of 30 weight percent aqueous solution of hydrogen peroxide. Then, 5.00 grams of 30 weight percent aqueous solution of hydrogen peroxide and 15.00 grams of the initiator solution were added to the reaction mixture. Next, the remainder of the initiator solution was fed linearly over 180 minutes while maintaining the reaction mixture temperature at 98° C. After the initiator feed was complete, the reaction mixture was held at a temperature of 98° C. for 30 minutes. The reaction mixture was cooled to 80° C. and a solution of 7.00 grams of sodium metabisulfite and 25.00 grams of deionized water was added. The molecular weight and weight percent residual maleic acid are reported in Table 1.

Examples 10 and 11 illustrate methods for preparing a polymer product formed from greater than 90 weight percent maleic acid using the process of the present invention.

TABLE 1

POLYMERIZATION RESULTS OF EXAMPLES 1-11

| Example | Composition | Mw | Wt % Residual Maleic[1] | Rxn Time[2] (hrs) | Wt % Rxn Solids[3] | Ratio Mol Base/ Mol Dicarb[4] | PPM of Metal[5] |
|---|---|---|---|---|---|---|---|
| Ex. 1 | 50 MAL/50 AA | 14,500 | 0.22 | 3.0 | 50.6 | 2.00 | 7.25 |
| Ex. 2 | 62.9 MAL/37.1 AA | 3860 | 0.01 | 3.0 | 47.8 | 1.60 | 5.80 |
| Ex. 3 | 70 MAL/30 AA | 3710 | 0.03 | 3.5 | 54.7 | 1.62 | 6.00 |
| Ex. 4 | 70 MAL/30 AA | 3630 | 0.01 | 2.5 | 52.7 | 1.60 | 12.00 |
| Ex. 5 | 70 MAL/30 AA | 3880 | 0.11 | 3.0 | 48.7 | 1.60 | 6.00 |
| Comp. Ex. 6 | 80 MAL/20 AA | 3780 | 1.82 | 2.5 | 52.7 | 1.55 | 0.00 |

TABLE 1-continued

POLYMERIZATION RESULTS OF EXAMPLES 1-11

| Example | Composition | Mw | Wt % Residual Maleic[1] | Rxn Time[2] (hrs) | Wt % Rxn Solids[3] | Ratio Mol Base/ Mol Dicarb[4] | PPM of Metal[5] |
|---|---|---|---|---|---|---|---|
| Ex. 7 | 80 MAL/20 AA | 3280 | 0.34 | 2.5 | 59.1 | 1.55 | 12.00 |
| Ex. 8 | 80 MAL/20 AA | 3380 | 0.32 | 2.5 | 56.2 | 1.20 | 12.00 |
| Ex. 9 | 80 MAL/20 AA | 3280 | 0.86 | 3.0 | 54.2 | 1.20 | 3.00 |
| Ex. 10 | 91 MAL/9 AA | 1820 | 0.77 | 2.5 | 52.2 | 1.20 | 9.00 |
| Ex. 11 | 100 MAL | 1180 | 0.16 | 3.5 | 50.6 | 1.10 | 9.00 |

Key to Table 1:
AA Percent by weight acrylic acid
MAL Percent by weight maleic acid
[1] Weight percent residual maleic acid in the polymer product
[2] Reaction time to when weight percent residual maleic acid was measured
[3] Weight percent reaction solids at completion of feeds of initiator and monomer.
[4] Total moles of base added to reaction mixture per mole dicarboxylic monomer.
[5] PPM of metal promoter as metal ion based on the total weight of monomer.

CALCIUM SEQUESTRATION

Polymer products produced by the process of the present invention are useful for sequestering alkaline earth metals as shown in TABLE 2. Several polymer products were measured for calcium sequestration by the following procedure:

a) A sample solution containing 300 ppm of polymer solids was prepared by adding 1.8 grams of a polymer product containing 5 weight percent polymer solids to 300 ml of a 0.008 M NaCl solution. The pH of the sample solution was adjusted to a pH of 10 by adding 2 weight percent solution of NaOH.

b) The sample solution was titrated with 15,000 ppm $CaCl_2$ as $CaCO_3$ to a 10 ppm calcium end point using a Brinkman 672 Titroprocessor equipped with a calcium sensitive electrode and connected to a Metrohm 655 Dosimat.

c) The calcium sequestration values shown in TABLE 2 are reported as milligrams calcium as $CaCO_3$ per gram polymer solids.

TABLE 2

| CALCIUM SEQUESTRATION PROPERTIES | | | |
|---|---|---|---|
| Polymer Product From | Composition | Mw | $Ca^{++}$ Sequestration |
| Comparative Acusol ® 445N* | 100 AA | 4,500 | 365 |
| Example 3 | 30 MAL/70 AA | 3800 | 468 |
| Example 1 | 50 MAL/50 AA | 14,500 | 489 |

Key to Table 2:
AA Percent by weight acrylic acid
MAL Percent by weight maleic acid
*Registered trademark of Rohm and Haas Company
The results show that the polymer products made by the process of the present invention may sequester calcium as $CaCO_3$ per gram polymer solids more effectively than polyacrylic acid of 4500 molecular weight.

INCRUSTATION INHIBITION

The polymer products made by the process of the present invention are useful as incrustation inhibitors.

The polymer products were tested for incrustation inhibiting properties by the following method: Test fabrics and 347 grams of ballast (cotton and cotton/polyester t-shirts) were laundered in a Kenwood Mini E European style home washing machine. The test fabrics laundered were a) 4-4"×4" Krefeld, b) 4-4"×4" small terry, and c) 1-12"×12" terry wash cloth all obtained from Test Fabrics in Middlesex, N.J. The test fabrics and ballast were laundered for 10 cycles with 90° C. wash water which had a hardness of 300 ppm Ca/Mg (weight ratio Ca/Mg of 3/1) using 6.5 grams of the detergent formulation shown in Table 3 per liter of wash water. The test fabrics were air dried and ashed at 800° C. for 2 hours. The inorganic content (incrustation) was determined and the results are shown in Table 4.

TABLE 3

| Test Detergent Formulation | |
|---|---|
| 8 wt % | Linear Alkyl Benzene Sulfonic Acid |
| 3 wt % | Tergitol ® 24-L-60 |
| 4 wt % | Na silicate (weight ratio 3.22 $SiO_2$: $1Na_2O$) |
| 20 wt % | Na perborate |
| 15 wt % | Na carbonate |
| 23 wt % | Zeolite ® 4A |
| 15 wt % | Na sulfate |
| 3 wt % | Stearic Acid |
| 1 wt % | Foamaster ® DS |
| 4 wt % | Water |
| 4 wt % | Polymer Product as polymer solids |

TABLE 4

EFFECTIVENESS OF POLYMER PRODUCT IN INHIBITING INCRUSTATION

| Polymer Product From | Composition | Mw | Percent Ash | | |
|---|---|---|---|---|---|
| | | | Krefeld | Small Terry | Terry Wash Cloth |
| Example 5 | 70 MAL/30 AA | | 1.97 | 1.93 | 1.31 |
| Example 2 | 65 MAL/35 AA | | 1.99 | 1.85 | 1.15 |

Key to Table 4:
AA Percent by weight acrylic acid
MAL Percent by weight maleic acid Table 4 shows that the polymer products produced by the process of the present invention are useful in detergent formulations for inhibiting incrustation in laundry applications.

PERFORMANCE IN AUTOMATIC DISHWASHERS

Test Method

This test method measures the build-up of spotting and filming on glassware when using automatic dishwashing detergents containing the polymer product. Glass tumblers were given five cycles in a dishwasher, in the presence of food soils, and the levels of spotting and filming allowed by the detergents under test were compared visually.

A Miele Model G590SC machine was used to perform the washing tests. The bottom rack of the dishwasher was randomly loaded with 10–15 dinner plates and the top rack was randomly loaded with several beakers, bowls, and cups. Four new 10 ounce glass tumblers were placed randomly on the top racks as the test glasses. Soil used in the test was a mixture of 80 percent Parkay® Margarine and 20 percent Carnation® Non-fat Dry milk.

When a test was ready to be started, the soil was smeared across the plates on the bottom rack, and the machine was started on its economy wash cycle which consists of the following: 1) a prerinse, 2) a main wash, 3) two rinses, and 4) dry cycle. After the prerinse, the machine was opened and a 60 gram detergent aliquot was placed in the detergent dispenser cup for the main cycle, and the water hardness, which is normally at 200 ppm hardness with a Ca++ to Mg++ weight ratio of 2:1, was adjusted to 400 ppm maintaining the same Ca++ to Mg++ ratio. The detergent formulation used is shown in TABLE 6 and the concentration of the detergent for each main wash was 3333 ppm. The temperature of the supply water was maintained at 130° F. The machine was then allowed to complete the economy wash cycle including the drying time. This procedure was followed for a total of five complete economy wash cycles for each set of test glasses.

When the final drying cycle was completed, the door was opened and the four glasses were removed and evaluated for filming and spotting. The test glasses were evaluated by placing them in light box equipped with a fluorescent light. The glasses were ranked according to the Film Rating System summarized in Table 5. The average rating for the four glasses is reported below in Table 7 for polymer products produced by the process of the present invention:

TABLE 5

| FILM AND SPOT RATING SYSTEM | | |
|---|---|---|
| Value | FILMING RATING | SPOT RATING |
| 0 | No film | No spots |
| 1 | Barely perceptible | Barely perceptible |
| 2 | Slight | Slight |
| 3 | Moderate | Moderate |
| 4 | Heavy | Heavy |

TABLE 6

| AUTOMATIC DISH DETERGENT FORMULATION TESTED (by weight) |
|---|
| 20.0% sodium carbonate |
| 10.0% sodium citrate.2H₂O |
| 15.0% perborate.4H₂O |
| 25.0% Britesil ® H₂O Silicate (2.0 SiO₂: 1Na₂O) |
| 0.5% Enzyme |
| 3% Olin Polytergent ® SLF-18 surfactant |
| 5% polymer product as polymer solid diluted to 100% with sodium sulfate |

TABLE 7

| PERFORMANCE IN AUTO DISH DETERGENT FORMULATIONS | | | | |
|---|---|---|---|---|
| Polymer Product From | Composition of Reaction Mixture | Mw | Film | Spot |
| | No Polymer | — | 2.0 | 1.0 |
| Comparative Acusol ® 445N | 100 AA | 4,500 | 0.0 | 0.5 |
| Example 4 | 70 MAL/30 AA | 3630 | 0.75 | 0 |
| Example 9 | 80 MAL/20 AA | 3510 | 0.5 | 0 |

Key to Table 7:
AA Percent by weight acrylic acid
MAL Percent by weight maleic acid The results in Table 7 show that the polymer product produced by the process of the present invention are effective in inhibiting the formation of spots and film in dishwashing detergent formulations.

We claim:

1. An aqueous free radical addition polymerization process for preparing a water soluble polymer product comprising:
    a) forming a reaction mixture comprising at least one monoethylenically unsaturated dicarboxylic acid monomer containing 4 to 10 carbon atoms, where the total dicarboxylic acid monomer added to the reaction mixture is from about 70 to 100 weight percent based on total weight of monomer, and at least one base in an amount of about 0.9 to about 1.70 equivalent moles of the base per mole of the dicarboxylic acid monomer;
    b) adding at least one metal promoter to the reaction mixture;
    c) feeding to the reaction mixture at least one water soluble initiator;
    d) feeding to the reaction mixture one or more optional other water soluble monoethylenically unsaturated monomers, where the total optional other water soluble monomer fed to the reaction mixture is from 0 to about 30 weight percent based on total weight of monomer;
    e) maintaining the reaction mixture at a reaction temperature of from about 80° C. to about 140° C. during the polymerization;
    f) maintaining the reaction mixture at a weight percent reaction solids of from about 50 to about 65 weight percent during the polymerization;
    g) feeding the monomer and the initiator and polymerizing the monomer for a polymerization reaction time of 3 hours or less; and
    h) recovering the polymer product, where the polymer product contains less than 1.5 weight percent residual dicarboxylic acid monomer, based on the total weight of polymer product; and
wherein all the base is added to the reaction mixture before the feeds of initiator and monomer are begun and wherein a portion of the water soluble initiator and the optional monoethylenically unsaturated monomer are added to the reaction mixture before any of the feeds to the reaction mixture are begun.

2. The process of claim 1 where the polymer product is formed from about 85 to 100 weight percent of at least one dicarboxylic acid monomer.

3. The process of claim 1 where the weight percent reaction solids of the reaction mixture during the polymerization is from about 50 to about 60 weight percent.

4. The process of claim 1 where the amount of base added to the reaction mixture is from about 0.95 to about 1.65 equivalent moles of base per mole of the dicarboxylic acid monomer.

5. The process of claim 1 where the amount of base added to the reaction mixture is from about 1.00 to about 1.60 equivalent moles of base per mole of the dicarboxylic acid monomer.

6. The process of claim 1 where the the level of metal promoter present in the reaction mixture is from about 1 to about 250 ppm metal ion based on the total weight of monomer.

7. The process of claim 5 where the level of metal promoter present in the reaction mixture is from about 1 to about 25 ppm metal ion based on the total weight of monomer.

8. The process of claim 1 where the metal promoter is selected from the group consisting of the water soluble salts of cobalt, iron, copper, cerium, nickel, manganese, molybdenum, zirconium, vanadium, zinc, and combinations thereof.

9. The process of claim 8 where the metal promoter is selected from the group consisting of the water soluble salts of iron, copper, and combinations thereof.

10. The process of claim 1 where the amount of water soluble initiator added to the reaction mixture is from about 0.5 to about 25 weight percent based on the total weight of monomer.

11. The process of claim 1 where the water soluble initiator added to the reaction mixture is a combination of peroxide and persulfate.

12. The process of claim 1 where from about 5 to about 20 weight percent of the water soluble initiator, and from about 10 to about 20 weight percent of the optional monoethylenically unsaturated monomer are added to the reaction mixture before any of the feeds to the reaction mixture are begun.

13. The process of claim 1 where the dicarboxylic acid monomer is selected from the group consisting of maleic acid, itaconic acid, mesaconic acid, fumaric acid, citraconic acid, alpha-methylene glutaric acid, maleic anhydride, cis-3,4,5,6-tetrahydrophthalic anhydride, and combinations thereof.

14. The process of claim 1 where the optional other water soluble monomer is selected from the group consisting of a water soluble monoethylenically unsaturated monocarboxylic acid containing 3 to 6 carbon atoms, a monoethylenically unsaturated carboxyl-free monomer, and combinations thereof.

15. The process of claim 14 where the monoethylenically unsaturated monocarboxylic acid is selected form the group consisting of acrylic acid, methacrylic acid, vinylacetic acid, crotonic acid, and their salts, and combinations thereof.

16. The process of claim 14 Where the monoethylenically unsaturated carboxyl-free monomer is selected form the group consisting of alkyl esters of acrylic acid, alkyl esters of methacrylic acid, hydroxyalkyl esters of acrylic acid, hydroxyalkyl esters of methacrylic acid, acrylamide, methacrylamide, N-tertiary-butylacrylamide, N-methylacrylamide, N,N-dimethylacrylamide; acrylonitrile, methacrylonitrile, allyl alcohol, allylsulfonic acid, allyl phosphonic acid, vinylphosphonic acid, dimethylaminoethyl acrylate, dimethylaminoethyl methacrylate, phosphoethyl methacrylate, N-vinylpyrollidone, N-vinylformamide, N-vinylimidazole, vinyl acetate, styrene, vinylsulfonic acid and its salts, and 2-acrylamido-2-methylpropanesulfonic acid and its salts, and combinations thereof.

17. The process of claim 1 where the residual level of dicarboxylic acid monomer in the polymer product is less than 1.1 weight percent.

18. The process of claim 1 where the residual level of dicarboxylic acid monomer in the polymer product is less than 0.9 weight percent.

* * * * *